(12) United States Patent
Scott et al.

(10) Patent No.: US 10,897,246 B2
(45) Date of Patent: Jan. 19, 2021

(54) RADIO FREQUENCY SWITCHING CIRCUITRY WITH REDUCED SWITCHING TIME

(71) Applicant: Qorvo US, Inc., Greensboro, NC (US)

(72) Inventors: Baker Scott, San Jose, CA (US);
George Maxim, Saratoga, CA (US);
Padmmasini Desikan, San Jose, CA (US); Dirk Robert Walter Leipold, San Jose, CA (US)

(73) Assignee: Qorvo US, Inc., Greensboro, NC (US)

(*) Notice: Subject to any disclaimer, the term of this patent is extended or adjusted under 35 U.S.C. 154(b) by 0 days.

(21) Appl. No.: 15/809,198

(22) Filed: Nov. 10, 2017

(65) Prior Publication Data
US 2019/0149142 A1    May 16, 2019

(51) Int. Cl.
*H03K 17/0412* (2006.01)
*H03K 17/693* (2006.01)
*H03K 19/21* (2006.01)

(52) U.S. Cl.
CPC ..... *H03K 17/04123* (2013.01); *H03K 17/693* (2013.01); *H03K 19/215* (2013.01); *H03K 2217/0054* (2013.01)

(58) Field of Classification Search
CPC ............................................... H03K 17/04123
See application file for complete search history.

(56) References Cited

U.S. PATENT DOCUMENTS

| | | | | |
|---|---|---|---|---|
| 6,172,383 B1* | 1/2001 | Williams | ............... | H02M 1/32 257/173 |
| 7,116,137 B2* | 10/2006 | Nautiyal | ............... | G11C 5/063 327/111 |
| 7,868,683 B2* | 1/2011 | Ilkov | ............... | H03K 17/04123 327/374 |
| 8,395,870 B2* | 3/2013 | Maede | ............... | H03K 19/0185 326/82 |
| 8,542,037 B2* | 9/2013 | Choy | ............... | H03K 17/6872 326/27 |

(Continued)

OTHER PUBLICATIONS

Extended European Search Report for European Patent Application No. 18196804.1, dated Mar. 20, 2019, 8 pages.

*Primary Examiner* — Lincoln D Donovan
*Assistant Examiner* — Colleen J O Toole
(74) *Attorney, Agent, or Firm* — Withrow & Terranova, P.L.L.C.

(57) ABSTRACT

RF switching circuitry includes a plurality of FETs coupled between an input node, an output node, and a gate drive node. When a positive power supply voltage is provided at the gate drive node, the plurality of FETs turn on and provide a low impedance path between the input node and the output node. When a negative power supply voltage is provided at the gate drive node, the plurality of FETs turn off and provide a high impedance path between the input node and the output node. Switch acceleration circuitry in the RF switching circuitry includes a bypass FET and multi-level driver circuitry. The bypass FET selectively bypasses the common resistor in response to a multi-level drive signal. The multi-level driver circuitry uses a built-in gate to capacitance of the bypass FET to provide the multi-level drive signal at an overvoltage that is above the positive power supply voltage.

15 Claims, 9 Drawing Sheets

(56) References Cited

U.S. PATENT DOCUMENTS

| | | | |
|---|---|---|---|
| 8,547,157 B1* | 10/2013 | Mangold | H03K 17/04123 |
| | | | 327/308 |
| 9,847,774 B2* | 12/2017 | Crandall | H03K 17/04 |
| 2014/0009206 A1 | 1/2014 | Madan et al. | |
| 2015/0137246 A1* | 5/2015 | Shapiro | H01L 27/027 |
| | | | 257/350 |
| 2017/0201245 A1* | 7/2017 | Scott | H04B 3/548 |
| 2017/0272066 A1 | 9/2017 | Scott et al. | |
| 2017/0302259 A1 | 10/2017 | Mokalla | |

* cited by examiner

RADIO FREQUENCY SWITCHING CIRCUITRY WITH REDUCED SWITCHING TIME

FIELD OF THE DISCLOSURE

The present disclosure relates to driver circuitry for radio frequency (RF) switching circuitry, and in particular to RF switching circuitry with faster switching times.

BACKGROUND

Figure 1:
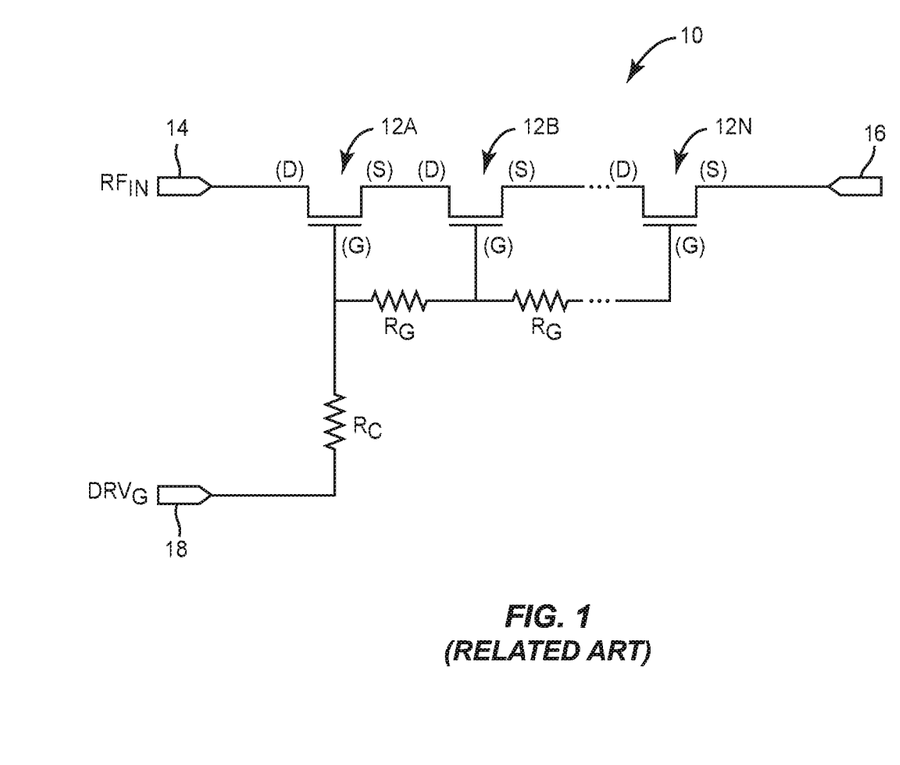
FIG. 1 is a functional schematic illustrating conventional radio frequency (RF) switching circuitry.

Radio frequency (RF) switching circuitry is an essential part of any wireless communication device. RF switching circuitry may be used to route RF signals between various nodes (e.g., a power amplifier and an antenna, an antenna and a low noise amplifier (LNA), and the like), to change the impedance of one or more nodes, or any number of other functions. Exemplary RF switching circuitry 10 is shown in FIG. 1. The RF switching circuitry 10 includes a number of field effect transistors (FETs) 12 (numbered individually from 12A to 12N) coupled drain (D) to source (S) between an input node 14 and an output node 16. A gate drive node 18 is coupled to a gate (G) of each of the FETs 10 via a common resistor $R_C$ and a number of gate resistors $R_G$. Specifically, the common resistor $R_C$ is coupled between the gate drive node 18 and a gate (G) of a first one of the FETs 12A. Each of the gate resistors $R_G$ is coupled between the gate contacts (G) of each adjacent pair of the FETs 12.

A gate drive signal $DRV_G$ provided at the gate drive node 18 places the FETs 12 in one of an on state or an off state. In the on state of the FETs 12, a low impedance path is provided between the input node 14 and the output node 16, thereby allowing an RF input signal $RF_{IN}$ at the input node 14 to pass to the output node 16. In the off state of the FETs 12, a high impedance path is provided between the input node 14 and the output node 16, thereby preventing the RF input signal $RF_{IN}$ at the input node 14 from reaching the output node 16. The RF switching circuitry 10 may be provided in a series configuration or a shunt configuration. In the series configuration, the input node 14 and the output node 16 are RF signal nodes. In the shunt configuration, the input node 14 is an RF signal node and the output node 16 is a ground node or coupled to a fixed impedance.

The gate drive signal $DRV_G$ may switch between a positive power supply voltage $V_{PP}$ and a negative power supply voltage $V_{NN}$. Generally, the negative power supply voltage $V_{PP}$ is provided by a voltage regulator while the negative power supply voltage $V_{NN}$ is generated from the positive power supply voltage $V_{PP}$ using a charge pump. In the case of a mobile device, the positive power supply voltage $V_{PP}$ may correspond with a battery voltage or a downregulated version thereof. The negative power supply voltage $V_{NN}$ may be generated in proportion to the magnitude of the positive power supply voltage $V_{PP}$ (e.g., if the positive power supply voltage $V_{PP}$ is 2.5V, the negative power supply voltage $V_{NN}$ may be −2.5V).

Figure 2:
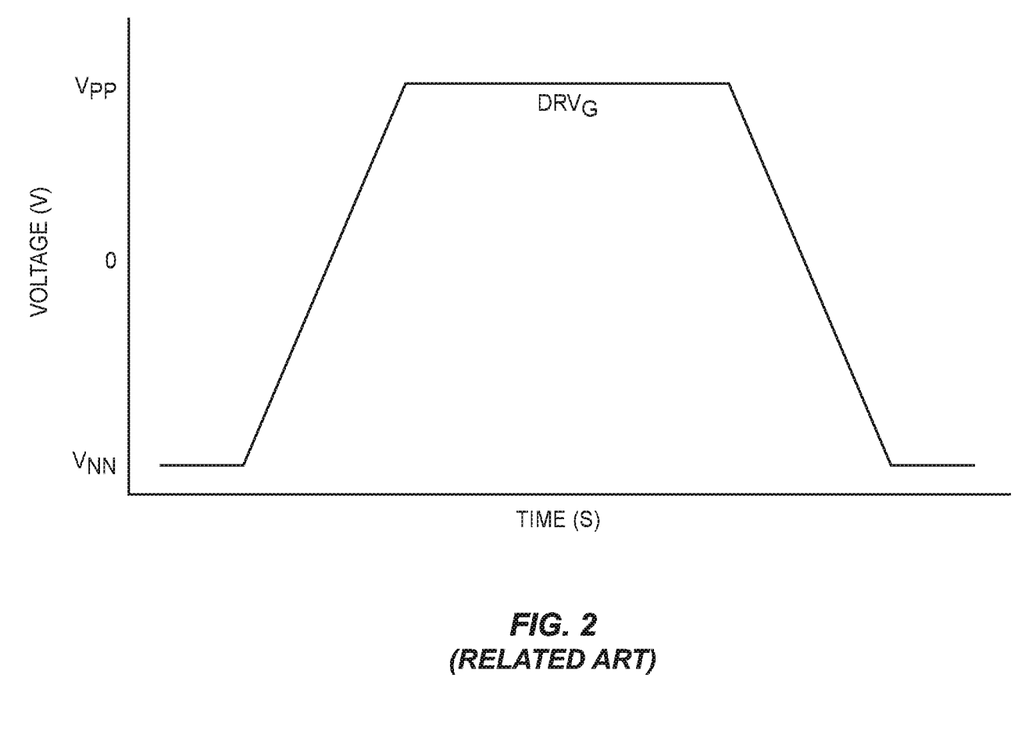
FIG. 2 is a graph illustrating a conventional gate drive signal for conventional RF switching circuitry.

A typical gate drive signal $DRV_G$ is illustrated in FIG. 2. To maintain the FETs 12 in an off state, the gate drive signal $DRV_G$ is provided at the negative power supply voltage $V_{NN}$. The negative power supply voltage $V_{NN}$ maintains the gate-to-source voltage $V_{GS}$ of each one of the FETs 12 well below a threshold voltage $V_{TH}$ thereof, ensuring that the FETs 12 remain off even when a drain-to-source voltage $V_{DS}$ of each one of the FETs 12 is large. To transition the FETs 12 into an on state, the gate drive signal $DRV_G$ slews from the negative power supply voltage $V_{NN}$ to the positive power supply voltage $V_{PP}$. As the gate-to-source voltage $V_{GS}$ of the FETs 12 rises above the threshold voltage $V_{TH}$ thereof, the FETs 12 turn on.

As will be appreciated by those skilled in the art, each one of the FETs 12 has an associated gate capacitance due to the physical structure thereof. This gate capacitance, along with the resistance provided by the common resistor $R_C$ and the gate resistors $R_G$, degrades the switching speed of the RF switching circuitry 10 as illustrated by Equation (1):

$$\tau = RC \tag{1}$$

where $\tau$ is the time required to charge or discharge the capacitance of each one of the FETs 12, which is inversely proportional to the time required to transition between the on state and the off state of the FETs 12, R is the resistance seen at the gate drive node 18, and C is the capacitance seen at the gate drive node 18. Such a reduction in the switching speed of the FETs 12 becomes problematic when RF standards (e.g., 5G, WiFi) demand very fast switching speeds (e.g., 100-200 ns).

One way to increase the switching speed of the RF switching circuitry 10 is by reducing the size of the common resistor $R_C$ and/or the gate resistors $R_G$. While doing so decreases the time constant r by reducing the resistance R seen at the gate drive node 18, it also increases the insertion loss of the RF switching circuitry 10 as large values of the common resistor $R_C$ and/or gate resistors $R_G$ prevent leakage of the RF input signal $RF_{IN}$ into the gate (G) of each one of the FETs 12. Another way to increase the switching speed of the RF switching circuitry 10 is by reducing the size of the FETs 12. While doing so decreases the gate capacitance of each one of the FETs and thus the time constant r by reducing the capacitance C seen at the gate drive node 18, it also decreases the power handling capability of the RF switching circuitry 10.

In light of the above, there is a need for an RF switch with improved switching time that maintains low insertion loss and high power handling capability.

SUMMARY

The present disclosure relates to driver circuitry for radio frequency (RF) switching circuitry, and in particular to RF switching circuitry with faster switching times. In one embodiment, RF switching circuitry includes an input node, an output node, a gate drive node, a plurality of field-effect transistors (FETs), and switch acceleration circuitry. The plurality of FETs are coupled between the input node, the output node, and the gate drive node. When a positive power supply voltage is provided at the gate drive node, the plurality of FETs turn on and provide a low impedance path between the input node and the output node. When a negative power supply voltage is provided at the gate drive node, the plurality of FETs turn off and provide a high impedance path between the input node and the output node. The switch acceleration circuitry includes a bypass FET and multi-level driver circuitry. The bypass FET selectively bypasses the common resistor in response to a multi-level drive signal. The multi-level driver circuitry uses a built-in gate to capacitance of the bypass FET to provide the multi-level drive signal at an overvoltage that is above the positive power supply voltage. By using the built-in gate capacitance of the bypass FET to provide the multi-level drive signal at an overvoltage that is above the positive power supply voltage, the multi-level driver circuitry is able to maintain the bypass FET in an on state during transitions of the plurality of FETs between states without the need for extra circuitry (e.g., a charge pump).

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 3:
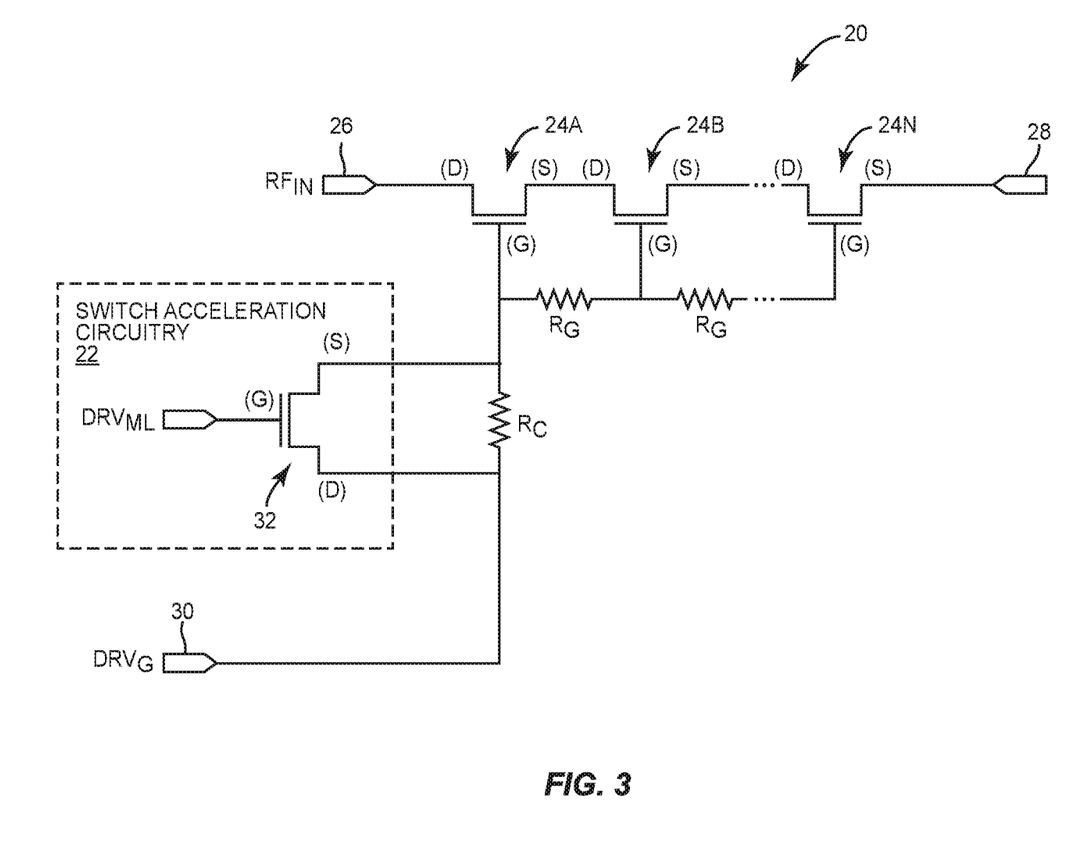
FIG. 3 is a functional schematic illustrating RF switching circuitry including switch acceleration circuitry according to one embodiment of the present disclosure.

FIG. 3 shows radio frequency (RF) switching circuitry 20 including switch acceleration circuitry 22 according to one embodiment of the present disclosure. The basic structure of the RF switching circuitry 20 is similar to that shown in FIG. 1 above and includes a number of field effect transistors (FETs) 24 (numbered individually as 24A to 24N) coupled drain (D) to source (S) between an input node 26 and an output node 28. A gate drive node 30 is coupled to a gate (G) of each of the FETs 24 via a common resistor $R_C$ and a number of gate resistors $R_G$. Specifically, the common resistor $R_C$ is coupled between the gate drive node 30 and a first one of the FETs 24A. Each one of the gate resistors $R_G$ is coupled between the gate contacts (G) of each adjacent pair of the FETs 24.

A gate drive signal $DRV_G$ provided at the gate drive node 30 places the FETs 24 in one of an on state or an off state. In the on state of the FETs 24, a low impedance path is provided between the input node 26 and the output node 28, thereby allowing an RF input signal $RF_{IN}$ at the input node 26 to pass to the output node 28. In the off state of the FETs 24, a high impedance path is provided between the input node 26 and the output node 28, thereby preventing the RF input signal $RF_{IN}$ at the input node 26 from reaching the output node 28. The RF switching circuitry 20 may be provided in a series configuration or a shunt configuration. In the series configuration, the input node 26 and the output node 28 are RF signal nodes. In the shunt configuration, the input node 26 is an RF signal node and the output node 28 is a ground node or coupled to a fixed impedance. As discussed herein, a low impedance path is one in which any FETs provided therein are on. As will be appreciated by those skilled in the art, FETs essentially provide a closed circuit when on, presenting a resistance that is equal to an on-state resistance of the one or more FETs. A high impedance path is one in which any FETs provided therein are off. As will be appreciated by those skilled in the art, FETs essentially provide an open circuit when off, presenting a resistance that is equal to an off-state resistance of the one or more FETs.

The gate drive signal $DRV_G$ may be provided by a gate driver (not shown), which switches the gate drive signal $DRV_G$ between a positive power supply voltage $V_{PP}$ and a negative power supply voltage $V_{NN}$ in response to a digital or logic-level control signal. Generally, the positive power supply voltage $V_{PP}$ is provided by a voltage regulator while the negative power supply voltage $V_{NN}$ is generated from the positive power supply voltage $V_{PP}$ using a charge pump. In the case of a mobile device, the positive power supply voltage $V_{PP}$ may correspond with a battery voltage or a downregulated version thereof. The negative power supply voltage $V_{NN}$ may be generated in proportion to the magnitude of the positive power supply voltage $V_{PP}$ (e.g., if the positive power supply voltage $V_{PP}$ is 2.5V, the negative power supply voltage $V_{NN}$ may be −2.5V).

As discussed above, the switching speed of the RF switching circuitry 20 is limited due to the combination of resistance of the common resistor $R_C$ and the gate resistors $R_G$ and capacitance of the FETs 24. In order to increase the switching speed of the RF switching circuitry 20, the switch acceleration circuitry 22 is configured to selectively bypass the common resistor $R_C$ as discussed below. To do so, the switch acceleration circuitry 22 includes a bypass FET 32 coupled across the common resistor $R_C$. Specifically, a drain (D) of the bypass FET 32 is coupled to the gate drive node 30, and a source contact (S) of the bypass FET 32 is coupled to the gate (G) of a first one of the FETs 24A. A gate (G) of the bypass FET 32 is configured to receive a multi-level drive signal $DRV_{ML}$. The multi-level drive signal $DRV_{ML}$ may switch between the negative power supply voltage $V_{NN}$, ground, and an over-voltage $V_O$, which is greater than the positive power supply voltage $V_{PP}$. When the multi-level drive signal $DRV_{ML}$ is provided at the negative power supply voltage $V_{NN}$ or ground, the bypass FET 32 remains off. At some point when the multi-level drive signal $DRV_{ML}$ is between ground and the over-voltage $V_O$, the bypass FET 32 turns on.

When the bypass FET 32 is on, the common resistor $R_C$ is bypassed and thus not presented to the gate drive node 30. When the bypass FET 32 is off, the common resistor $R_C$ is not bypassed and thus presented to the gate drive node 30. Bypassing the common resistor $R_C$ substantially reduces the resistance R presented to the gate drive node 30 and therefore the time constant τ discussed above with respect to Equation (1). Accordingly, the switching speed of the RF switching circuitry 20 may be substantially improved when the common resistor $R_C$ is bypassed.

Figure 4:
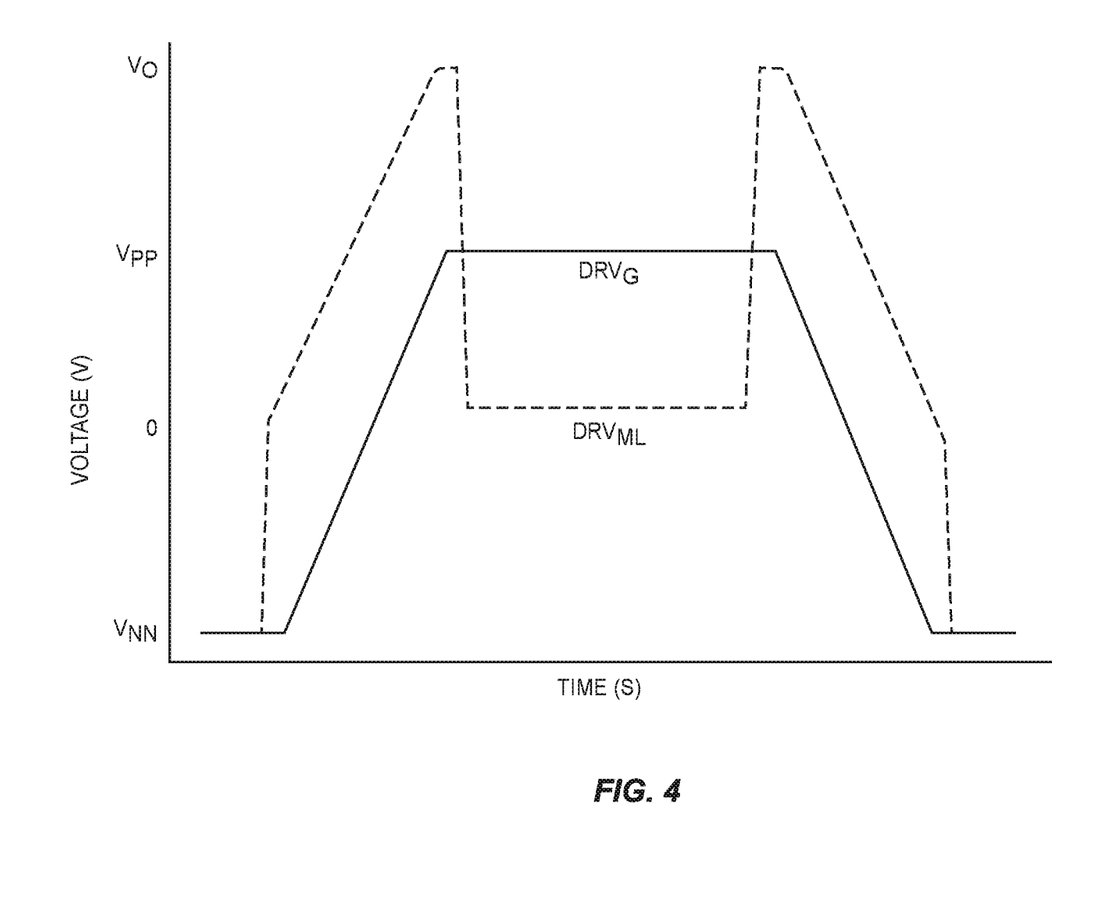
FIG. 4 is a graph illustrating a multi-level drive signal for switch acceleration circuitry according to one embodiment of the present disclosure.

A large resistance at the gate (G) of each one of the FETs 24 is necessary to avoid leakage of the RF input signal $RF_{IN}$ into the gate (G). Accordingly, it is desirable to bypass the common resistor $R_C$ only when turning on or off the RF switching circuitry 20 and not during steady state operation thereof. Doing so increases the switching speed of the RF switching circuitry 20 without adversely affecting the insertion loss thereof. FIG. 4 shows an exemplary multi-level drive signal $DRV_{ML}$ according to one embodiment of the present disclosure configured to do so. The gate drive signal $DRV_G$ for the FETs 24 is also shown for context. Specifically, FIG. 4 shows the gate drive signal $DRV_G$ as a solid line and the multi-level drive signal $DRV_{ML}$ as a dashed line.

To maintain the FETs 24 and the bypass FET 32 in an off state, the gate drive signal $DRV_G$ and the multi-level drive signal $DRV_{ML}$ are provided at the negative power supply voltage $V_{NN}$. As discussed above, the negative power supply voltage $V_{NN}$ maintains the gate-to-source voltage $V_{GS}$ of each one of the FETs 24 well below a threshold voltage $V_{TH}$ thereof, ensuring that the FETs 24 remain off even when a drain-to-source voltage $V_{DS}$ of each one of the FETs 24 is large. Similarly, the negative power supply voltage $V_{NN}$ maintains the gate-to-source $V_{GS}$ voltage of the bypass FET 32 well below a threshold voltage $V_{TH}$ thereof such that the bypass FET 32 remains off. To transition the FETs 24 into an on state, the gate drive signal $DRV_G$ slews from the negative power supply voltage $V_{NN}$ to the positive power supply voltage $V_{PP}$. As the gate-to-source voltage $V_{GS}$ of the FETs 24 rises above the threshold voltage $V_{TH}$ thereof, the FETs 24 turn on. Before this occurs, however, the multi-level drive signal $DRV_{ML}$ slews from the negative power supply voltage $V_{NN}$ to ground. Then, as the gate drive signal $DRV_G$ slews from the negative power supply voltage $V_{NN}$ to the positive power supply voltage $V_{PP}$, the multi-level drive signal $DRV_{ML}$ similarly slews from ground to the over-voltage $V_O$, maintaining a headroom of 2.5V above the switching control signal $CNT_{SW}$. As discussed below, the multi-level drive signal is provided by utilizing the built-in capacitance of the bypass FET 32 and thus does not require separate circuitry (e.g., a charge pump) to generate the over-voltage $V_O$. As the gate-to-source voltage $V_{GS}$ of the bypass FET 32 rises above the threshold voltage $V_{TH}$ thereof, the bypass FET 32 turns on to bypass the common resistor $R_C$. The 2.5V headroom above the switching control signal $CNT_{SW}$ ensures that the bypass FET 32 remains on throughout the entirety of the turn on of the FETs 24. If the bypass control signal $CNT_{BP}$ did not maintain a headroom above the switching control signal $CNT_{SW}$, the gate-to-source voltage $V_{GS}$ of the bypass FET 32 would not be sufficiently greater than the threshold voltage $V_{TH}$ thereof, and the bypass FET 32 would turn off.

When the gate drive signal $DRV_G$ is done slewing from the negative power supply voltage $V_{NN}$ to the positive power supply voltage $V_{PP}$ and the FETs 24 are thus turned on, the multi-level drive signal $DRV_{ML}$ drops to ground such that the bypass FET 32 is turned off and the common resistor $R_C$ is no longer bypassed. Doing so reduces leakage of the RF input signal $RF_{IN}$ from drain-to-gate or source-to-gate in each of the FETs 24 while the RF input signal $RF_{IN}$ is passed from the input node 26 to the output node 28.

To turn the FETs 24 back off, the process is reversed. The bypass FET 32 is first turned on by raising the multi-level drive signal $DRV_{ML}$ from ground back to the over-voltage $V_O$. The gate drive signal $DRV_G$ slews from the positive power supply voltage $V_{PP}$ back to the negative power supply voltage $V_{NN}$, and the multi-level drive signal $DRV_{ML}$ maintains a 2.5V headroom over the gate drive signal $DRV_G$ during this slewing.

The gate drive signal $DRV_G$ and the multi-level drive signal $DRV_{ML}$ shown in FIG. 4 represent ideal waveforms.

Operating the RF switching circuitry 20 and the switch acceleration circuitry 22 in this manner significantly increases the switching speed of the RF switching circuitry 20 without increasing insertion loss or reducing power handling capability. However, generating the multi-level drive signal $DRV_{ML}$ may require a significant increase in area and complexity of the RF switching circuitry 20 due to the requirement that the multi-level drive signal $DRV_{ML}$ range from the negative power supply voltage $V_{NN}$ to the over-voltage $V_O$. As discussed above, gate drive signals for RF switches are generally provided by a gate driver that is capable of providing voltages between the negative power supply voltage $V_{NN}$ and the positive power supply voltage $V_{PP}$. Those skilled in the art will appreciate that the positive power supply voltage $V_{PP}$ may be provided by a regulated voltage source (e.g., a main power supply), while the negative power supply voltage $V_{NN}$ may be generated from the positive power supply voltage $V_{PP}$ using a charge pump. To provide the over-voltage $V_O$ according to conventional means, an additional charge pump would be required. Since charge pumps consume a relatively large area in a device, this would significantly increase the area and complexity of the RF switching circuitry 20 and thus may be unsuitable for certain applications (e.g., mobile devices) in which space is limited.

Figure 5:
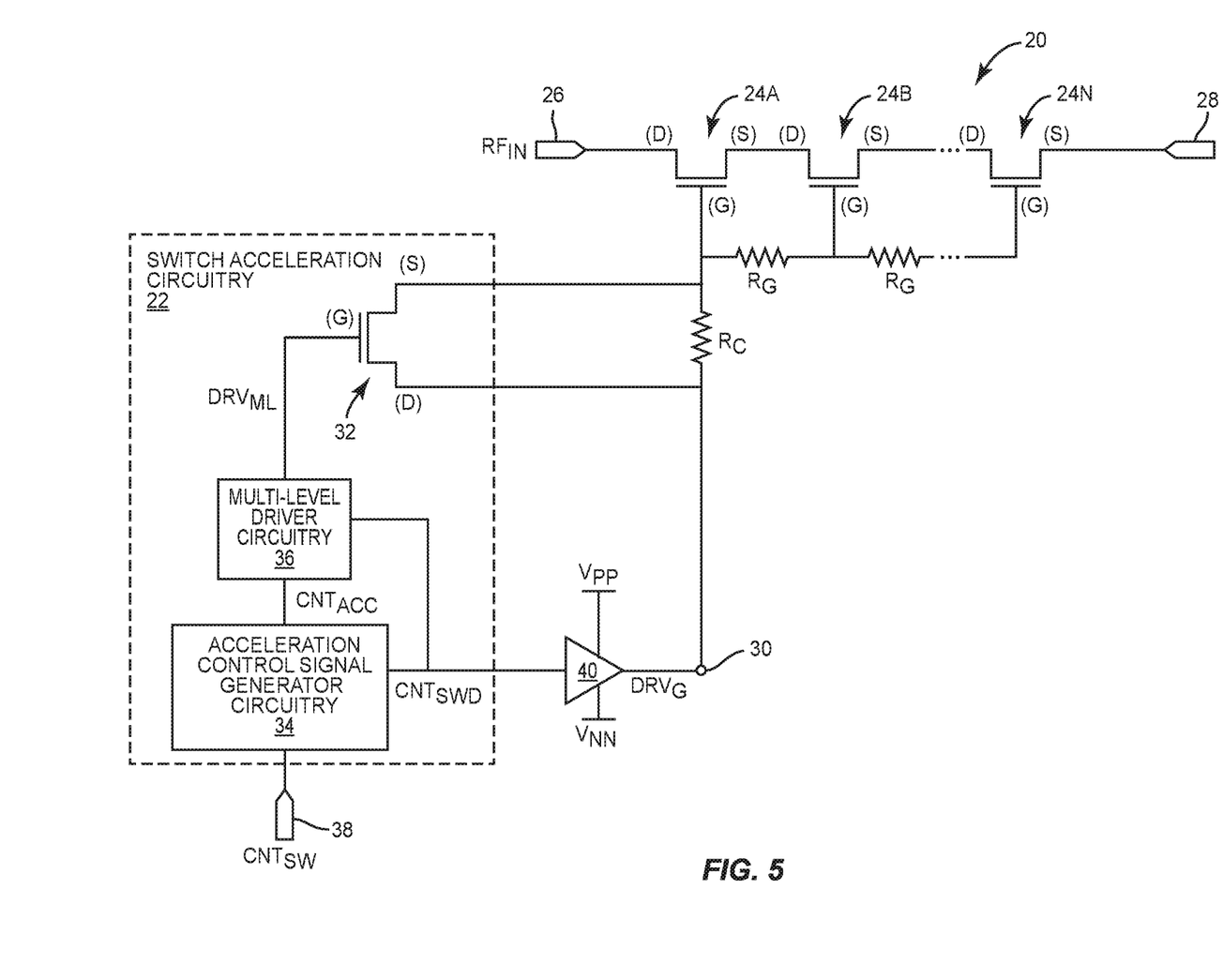
FIG. 5 is a functional schematic illustrating RF switching circuitry including switch acceleration circuitry according to one embodiment of the present disclosure.

To solve this problem, FIG. 5 shows the RF switching circuitry 20 and the switch acceleration circuitry 22 according to one embodiment of the present disclosure. The RF switching circuitry 20 is substantially similar to that described above with respect to FIG. 3. The switch acceleration circuitry 22 includes the bypass FET 32, acceleration control signal generator circuitry 34, and multi-level driver circuitry 36. The acceleration control signal generator circuitry 34 is configured to receive a switching control signal $CNT_{SW}$ from a switching control signal input node 38 and provide a delayed switching control signal $CNT_{SWD}$ and an acceleration control signal $CNT_{ACC}$. The delayed switching control signal $CNT_{SWD}$ is provided to a gate driver 40, which provides one of the positive power supply voltage $V_{PP}$ and the negative power supply voltage $V_{NN}$ as the gate drive signal $DRV_G$ to the gate drive node 30. The switching control signal $CNT_{SW}$, the delayed switching control signal $CNT_{SWD}$, and the acceleration control signal $CNT_{ACC}$ may be digital or logic-level signals (e.g., from 0V to 2.5V). Accordingly, the acceleration control signal generator circuitry 34 may be digital circuitry, the details of which are discussed below. The gate driver 40 may provide the negative power supply voltage $V_{NN}$ when the delayed switching control signal $CNT_{SWD}$ is low and provide the positive power supply voltage $V_{PP}$ when the delayed switching control signal $CNT_{SWD}$ is high.

The multi-level driver circuitry 36 is configured to receive the acceleration control signal $CNT_{ACC}$ and provide the multi-level drive signal $DRV_{ML}$ to the bypass FET 32. Specifically, the multi-level driver circuitry 36 uses a built-in capacitance of the bypass FET 32 to provide the multi-level drive signal $DRV_{ML}$ using only the positive power supply voltage $V_{PP}$ and the negative power supply voltage $V_{NN}$, thereby foregoing the need for additional charge pumps or other voltage generators in the RF switching circuitry 20 as discussed below.

Figure 6:
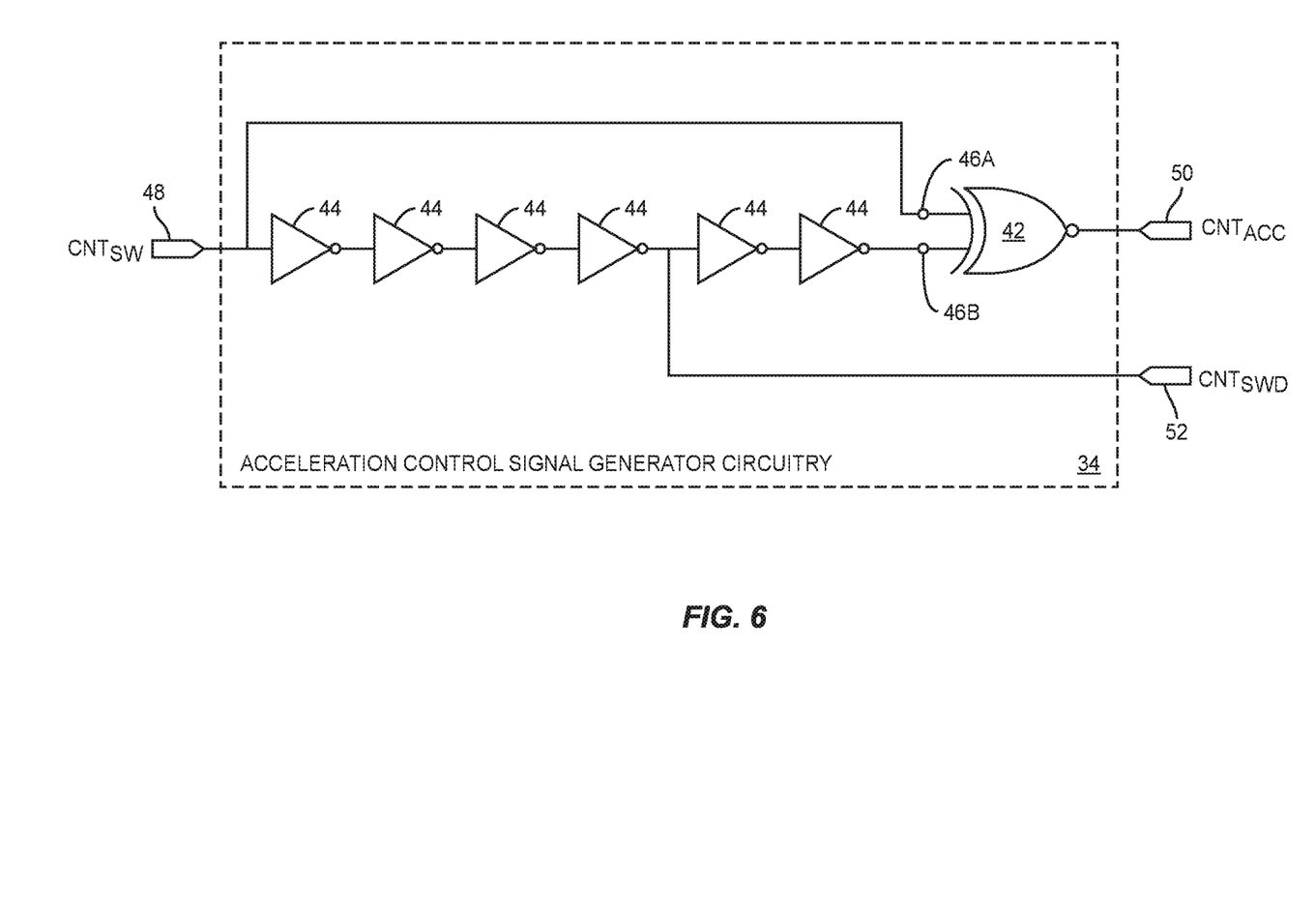
FIG. 6 is a functional schematic showing acceleration control signal generator circuitry for switch acceleration circuitry according to one embodiment of the present disclosure.

FIG. 6 shows details of the acceleration control signal generator circuitry 34 according to one embodiment of the present disclosure. The signal delay circuitry includes an exclusive-NOR gate 42 and a number of inverters 44. The exclusive-NOR gate 42 includes a first input node 46A and a second input node 46B. The first input node 46A is coupled to a switching control signal input node 48, at which the switching control signal $CNT_{SW}$ is provided. The inverters 44 are coupled in series between the switching control signal input node 48 and the second input node 46B. An output of the exclusive-NOR gate 42 is coupled to an acceleration control signal output node 50, which provides the acceleration control signal $CNT_{ACC}$. A delayed switching control signal output node 52 is coupled to an output of one of the inverters 44 that is not directly coupled to the second input node 46B of the exclusive-NOR gate 42. Those skilled in the art will appreciate that the acceleration control signal generator circuitry 34 shown in FIG. 6 is merely exemplary. That is, there are any number of ways to create the acceleration control signal $CNT_{ACC}$ and the delayed switching control signal $CNT_{SWD}$ from the switching control signal $CNT_{SW}$, all of which are contemplated herein.

Figure 7:
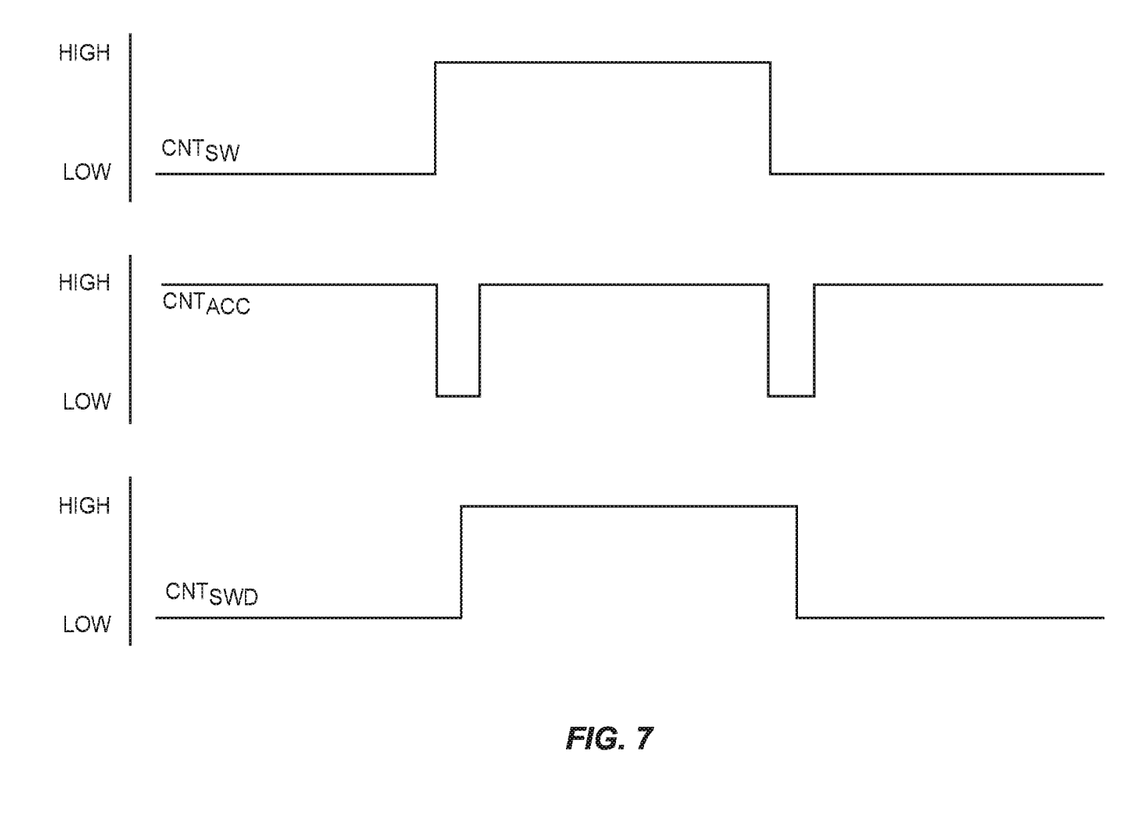
FIG. 7 is a graph illustrating various digital control signals generated by acceleration control signal generator circuitry according to one embodiment of the present disclosure.

FIG. 7 illustrates exemplary waveforms for the switching control signal $CNT_{SW}$, the acceleration control signal $CNT_{ACC}$, and the delayed switching control signal $CNT_{SWD}$ according to one embodiment of the present disclosure. As illustrated, when the switching control signal $CNT_{SW}$ transitions from low to high, the acceleration control signal $CNT_{ACC}$ transitions from high to low since the first input node 46A of the exclusive-NOR gate 42 is high while the second input node 46B is low. As the rising edge of the switching control signal $CNT_{SW}$ propagates through each of the inverters 44, the switching control signal $CNT_{SW}$ is inverted and slightly delayed. When the rising edge of the switching control signal $CNT_{SW}$ reaches the delayed switching control signal output node 52, the delayed switching control signal $CNT_{SWD}$ transitions from low to high. The delay between the rising edge of the switching control signal $CNT_{SW}$ and the delayed switching control signal $CNT_{SWD}$ is determined by the number of inverters 44 between the switching control signal input node 48 and the delayed switching control signal output node 52. The rising edge of the switching control signal $CNT_{SW}$ continues propagating through the remaining inverters 44 between the delayed switching control signal output node 52 and the second input node 46B of the exclusive-NOR gate 42, where it eventually causes the acceleration control signal $CNT_{ACC}$ to transition from low to high due to the fact that both the first input node 46A and the second input node 46B of the exclusive-NOR gate 42 are high at this point.

When the switching control signal $CNT_{SW}$ transitions from high to low, the acceleration control signal $CNT_{ACC}$ transitions from high to low since the first input node 46A of the exclusive-NOR gate 42 is now low while the second input node 46B is high. The falling edge of the switching control signal $CNT_{SW}$ then propagates through the inverters 44 to the delayed switching control signal output node 52, causing the delayed switching control signal $CNT_{SWD}$ to transition from high to low. When the falling edge of the switching control signal $CNT_{SW}$ propagates through the remaining inverters 44 between the delayed switching control signal output node 52 and the second input node 46B of the exclusive-NOR gate 42, the acceleration control signal $CNT_{ACC}$ transitions from low to high because both the first input node 46A and the second input node 46B of the exclusive-NOR gate 42 are now low.

Figure 8:
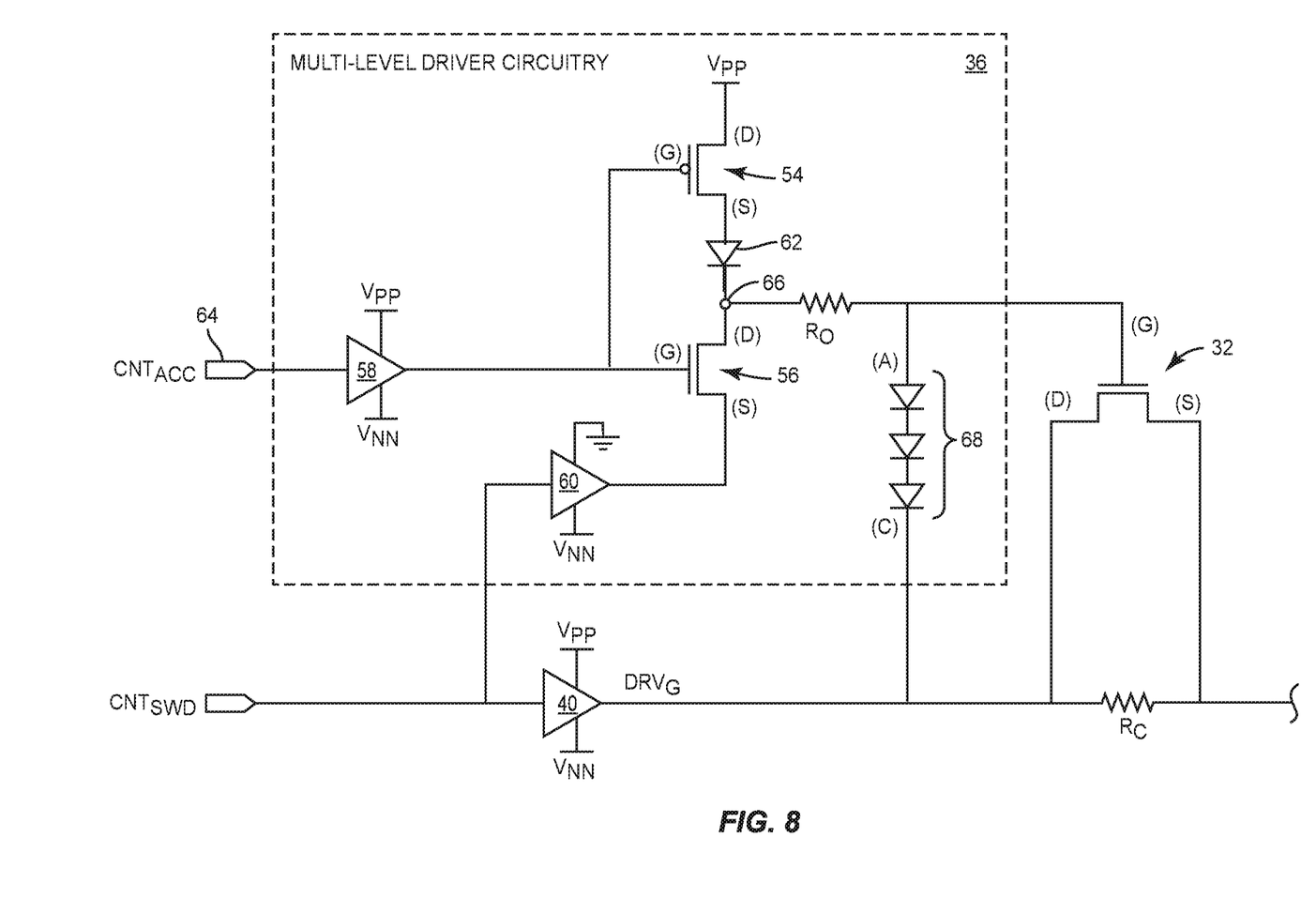
FIG. 8 is a functional schematic illustrating multi-level driver circuitry for switch acceleration circuitry according to one embodiment of the present disclosure.

FIG. 8 shows the multi-level driver circuitry 36 according to one embodiment of the present disclosure. For context, the bypass FET 32, the gate driver 40, and the common resistor $R_D$ are also shown. The multi-level driver circuitry 36 includes a first multi-level driver FET 54, a second multi-level driver FET 56, a first sub-driver 58, and a second sub-driver 60. The first multi-level driver FET 54 includes a drain (D) configured to receive the positive power supply voltage $V_{PP}$, a source (S) coupled to an anode (A) of a multi-level driver diode 62, and a gate (G) coupled to an output of the first sub-driver 58. An input of the first sub-driver 58 is coupled to an acceleration control signal input node 64. A cathode (C) of the multi-level driver diode 62 is coupled to a multi-level drive signal output node 66. The second multi-level driver FET 56 includes a drain (D) coupled to the multi-level drive signal output node 66, a source (S) coupled to an output of the second sub-driver 60, and a gate (G) coupled to the output of the first sub-driver 58. An input of the second sub-driver 60 is configured to receive the delayed switching control signal $CNT_{SWD}$. An output resistor $R_O$ is coupled between the multi-level drive signal output node 66 and the gate (G) of the bypass FET 32. A number of overvoltage protection diodes 68 are coupled anode (A) to cathode (C) between the gate (G) of the bypass FET 32 and an output of the gate driver 40.

In one embodiment, the first multi-level driver FET 54 is a p-channel depletion mode metal-oxide semiconductor FET (MOSFET) configured to be on when a voltage below a threshold voltage of the device is provided at the gate (G) and turn off when a voltage above the threshold voltage of the device is provided at the gate (G). The first sub-driver 58 may be configured to provide one of the positive power supply voltage $V_{PP}$ and the negative power supply voltage $V_{NN}$ at the output thereof based on the acceleration control signal $CNT_{ACC}$. Specifically, the first sub-driver 58 may provide the positive power supply voltage $V_{PP}$ at the output thereof when the acceleration control signal $CNT_{ACC}$ is high and provide the negative power supply voltage $V_{NN}$ at the output thereof when the acceleration control signal $CNT_{ACC}$ is low. The second multi-level driver FET 56 may be an n-channel enhancement mode MOSFET configured to be off when a voltage below a threshold voltage of the device is provided at the gate (G) and turn on when a voltage above the threshold voltage of the device is provided at the gate (G). The second sub-driver 60 may be configured to provide one of the negative power supply voltage $V_{NN}$ or ground to the source (S) of the second multi-level driver FET 56 based on the delayed switching control signal $CNT_{SWD}$. Specifically, the second sub-driver 60 may be configured to couple the output thereof to ground when the delayed switching control signal $CNT_{SWD}$ is high and provide the negative power supply voltage $V_{NN}$ at the output thereof when the delayed switching control signal $CNT_{SWD}$ is low.

When the switching control signal $CNT_{SW}$ is low and the RF switching circuitry 20 is in a steady-state condition, the acceleration control signal $CNT_{ACC}$ is high and the delayed switching control signal $CNT_{SWD}$ is low. In response to these control signals, the first sub-driver 58 provides the positive power supply voltage $V_{PP}$ at the output thereof and the second sub-driver 60 provides the negative power supply voltage $V_{NN}$ at the output thereof. The first multi-level driver FET 54 is thus off (depletion mode) while the second multi-level driver FET 56 is on (enhancement mode). Accordingly, the multi-level drive signal output node 66 is coupled to the negative power supply voltage $V_{NN}$ and held there, as illustrated in the first portion of the multi-level drive signal $DRV_{ML}$ shown in FIG. 4. When the switching control signal $CNT_{SW}$ transitions from low to high, the acceleration control signal $CNT_{ACC}$ transitions from high to low. Accordingly, the first sub-driver 58 provides the negative power supply voltage $V_{NN}$ at the output thereof, causing the first multi-level driver FET 54 to turn on and the second multi-level driver FET 56 to turn off. The multi-level drive signal output node 66 is thus coupled to VPP through the first multi-level driver FET 54. The gate drive signal $DRV_G$ is still at the negative power supply voltage $V_{NN}$ at this time. To avoid overloading the bypass FET 32 with a large gate-to-source or gate-to-drain voltage, the overvoltage protection diodes 68 limit the voltage at the multi-level drive signal output node 66. In one embodiment, the overvoltage protection diodes 68 limit the voltage at the multi-level drive signal output node 66 to −2.5V above a voltage of the gate drive signal $DRV_G$.

Those skilled in the art will appreciate that the bypass FET 32 has an associated gate capacitance. As the delayed switching control signal $CNT_{SWD}$ transitions from low to high causing the output of the gate driver 40 to slew from the negative power supply voltage $V_{NN}$ to the positive power supply voltage $V_{PP}$, the charge stored in the gate capacitance of the bypass FET 32 allows the gate (G) thereof and thus the multi-level drive signal output node 66 to float above the positive power supply voltage $V_{PP}$. The multi-level driver diode 62 prevents current from flowing back into the multi-level drive signal output node 66 in order to keep the charge in the gate capacitance of the bypass FET 32. This ensures a headroom between the gate drive signal $DRV_G$ and the multi-level drive signal $DRV_{ML}$ as shown in FIG. 4. As discussed above, this headroom ensures that the bypass FET 32 remains on throughout the transition of the FETs 24 in the RF switching circuitry 20 from off to on, thereby bypassing the common resistor $R_D$ during the transition and significantly improving switching times.

The transition from low to high of the delayed switching control signal $CNT_{SWD}$ also causes the second sub-driver 60 to couple the output thereof to ground. As the acceleration control signal $CNT_{ADD}$ transitions from low to high, the first sub-driver 58 provides the positive power supply voltage $V_{PP}$ at the output thereof, thereby turning the first multi-level driver FET 54 off and the second multi-level driver FET 56 on. Accordingly, the multi-level drive signal output node 66 is effectively coupled to ground. The same process is effectively reversed when turning the FETs 24 in the RF switching circuitry 20 from on to off.

Notably, the multi-level driver circuitry 36 shown in FIG. 8 is merely exemplary. Those skilled in the art will appreciate that the functionality of the multi-level driver circuitry 36 may be implemented in any number of ways, all of which are contemplated herein. In general, the multi-level driver circuitry 36 is able to generate a multi-level drive signal $DRV_{ML}$ using only the positive power supply voltage $V_{PP}$ and the negative power supply voltage $V_{NN}$ without using any additional charge pumps. To do so, the multi-level driver circuitry 36 leverages a built-in gate capacitance of the bypass FET 32. Doing so allows for lean and simple circuitry that is able to increase the switching speed of RF switching circuitry 20 using a single control signal.

Figure 9:
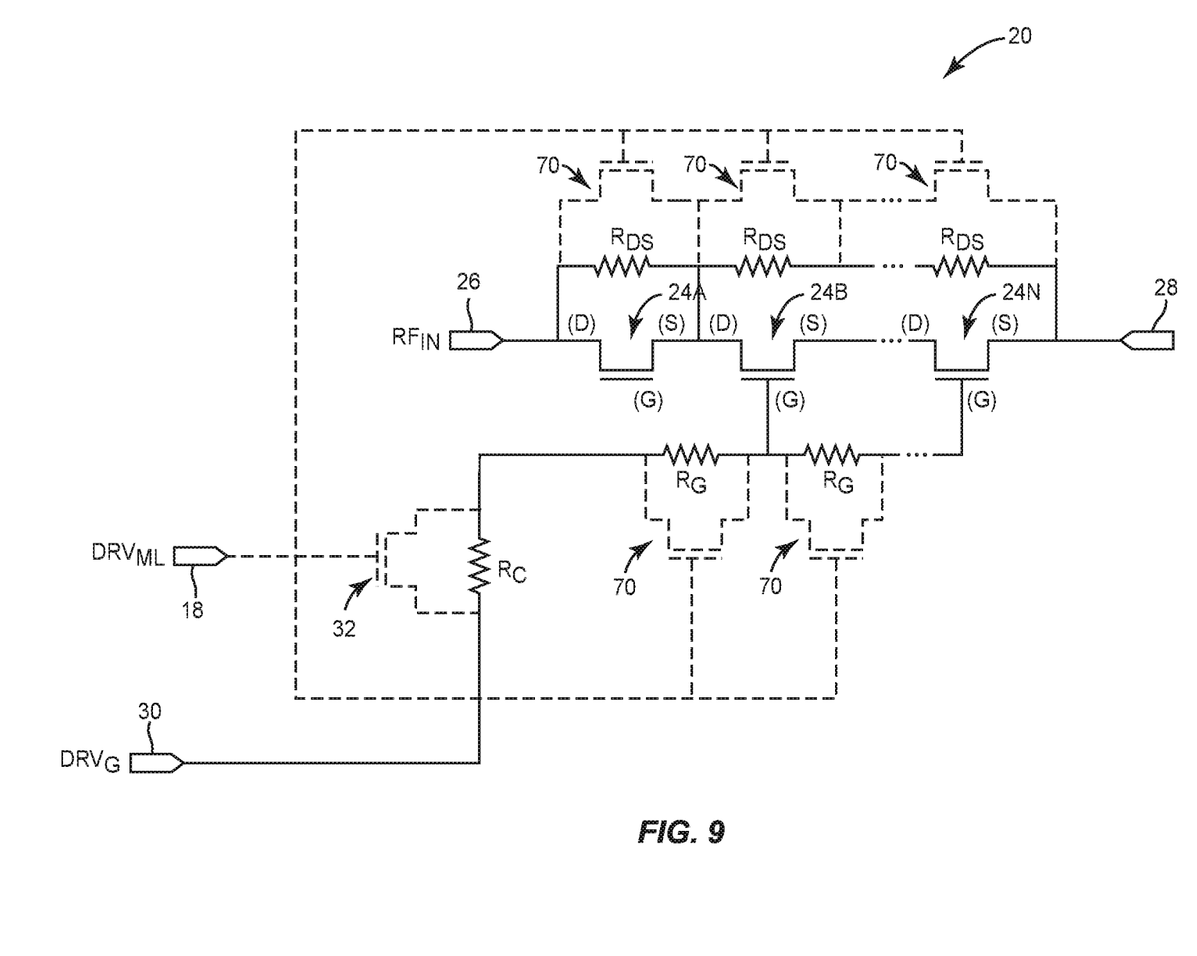
FIG. 9 is a functional schematic illustrating RF switching circuitry according to one embodiment of the present disclosure.

In addition to bypassing the common resistor $R_C$, the principles of the present disclosure may also be used to bypass one or more of the gate resistors $R_G$ and/or one or more drain-source bias resistors $R_{DS}$ as illustrated in FIG. 9. Those skilled in the art will appreciate that the RF switching circuitry 20 may include the drain-source bias resistors $R_{DS}$ between a drain (D) and a source (S) of each one of the FETs 24. Additional bypass FETs 70 may be provided in order to bypass one or more of these drain-source bias resistors $R_{DS}$ and/or one or more of the gate resistors $R_G$. The same multi-level drive signal $DRV_{ML}$ may be used for each one of these additional bypass FETs 70, or additional multi-level drive signals $DRV_{ML}$ may be generated on an individual or group basis for these additional bypass FETs 70 using the principles described throughout the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. Radio frequency (RF) switching circuitry comprising:
an input node, an output node, and a gate drive node;
a plurality of field-effect transistors (FETs) coupled between the input node, the output node, and the gate drive node such that a gate contact of each one of the plurality of FETs is coupled to the gate drive node via a common resistor, wherein the plurality of FETs is configured to:
turn on and provide a low impedance path between the input node and the output node when a gate drive signal at the gate drive node is provided at a positive power supply voltage; and
turn off and provide a high impedance path between the input node and the output node when the gate drive signal is provided at a negative power supply voltage, wherein the high impedance path has a higher impedance than the low impedance path; and
switch acceleration circuitry comprising:
a bypass FET configured to selectively bypass the common resistor in response to a multi-level drive signal;
acceleration control signal generator circuitry configured to receive a digital switching control signal and provide a delayed digital switching control signal and a digital acceleration control signal, wherein the delayed digital switching control signal is used to generate the gate drive signal and the digital acceleration control signal is used to generate the multi-level drive signal; and
multi-level driver circuitry configured to use a built-in gate capacitance of the bypass FET in order to provide the multi-level drive signal at an overvoltage that is above the positive power supply voltage, wherein the multi-level driver circuitry comprises a multi-level driver diode having a cathode coupled to a gate of the bypass FET to maintain charge stored by the built-in gate capacitance of the bypass FET, wherein the multi-level driver circuitry comprises:
a first sub-driver configured to receive the acceleration control signal and provide one of the positive power supply voltage and the negative power supply voltage at a first sub-driver output node;
a second sub-driver configured to receive the delayed switching control signal and provide one of a ground and the negative power supply voltage at a second sub-driver output node;
a first multi-level driver FET coupled between a positive power supply voltage node, an anode of the multi-level driver diode, and the first sub-driver output node and configured to selectively provide a low impedance path between the positive power supply voltage node and the anode of the multi-level driver diode when the negative power supply voltage is provided at the first sub-driver output node and provide a high impedance path between the positive power supply voltage node and the anode of the multi-level driver diode when the positive power supply voltage is provided at the first sub-driver output node;
a multi-level drive signal output node coupled to a cathode of the multi-level driver diode; and
a second multi-level driver FET coupled between the multi-level drive signal output node, the second sub-driver output node, and the first sub-driver output node and configured to selectively provide a low impedance path between the multi-level drive signal output node and the second sub-driver output node when the positive power supply voltage is provided at the first sub-driver output node and provide a high impedance path between the multi-level drive signal output node and the second sub-driver output node when the negative power supply voltage is provided at the first sub-driver output node.

2. The RF switching circuitry of claim 1 wherein the multi-level driver circuitry is configured to cause the bypass FET to bypass the common resistor when the plurality of FETs is transitioning between states and not bypass the common resistor during steady state operation of the plurality of FETs.

3. The RF switching circuitry of claim 1 wherein the plurality of FETs is coupled in series between the input node and the output node.

4. The RF switching circuitry of claim 3 wherein the plurality of FETs is coupled in series between the input node and the output node such that a drain contact of a first one of the plurality of FETs is coupled to the input node, a source contact of a last one of the plurality of FETs is coupled to the output node, and the remaining FETs are coupled drain-to-source between the first one of the plurality of FETs and the last one of the plurality of FETs.

5. The RF switching circuitry of claim 1 further comprising a plurality of gate resistors each coupled between a gate contact of each adjacent pair of FETs in the plurality of FETs.

6. The RF switching circuitry of claim 5 wherein the switch acceleration circuitry further comprises an additional bypass FET configured to selectively bypass one of the plurality of gate resistors in response to the multi-level drive signal.

7. The RF switching circuitry of claim 6 further comprising a plurality of drain-source bias resistors coupled between a drain contact and a source contact of each one of the plurality of FETs.

8. The RF switching circuitry of claim 7 wherein the switch acceleration circuitry further comprises a second additional bypass FET configured to selectively bypass one of the plurality of drain-source bias resistors in response to the multi-level drive signal.

9. The RF switching circuitry of claim 1 further comprising a plurality of drain-source bias resistors coupled between a drain contact and a source contact of each one of the plurality of FETs.

10. The RF switching circuitry of claim 9 wherein the switch acceleration circuitry further comprises an additional bypass FET configured to selectively bypass one of the plurality of drain-source bias resistors in response to the multi-level drive signal.

11. The RF switching circuitry of claim 1 wherein the bypass FET includes a drain contact coupled to the gate drive node, a source contact coupled to a gate contact of one of the plurality of FETs, and a gate contact coupled to the multi-level driver circuitry.

12. The RF switching circuitry of claim 1 further comprising a gate driver coupled to the gate drive node, wherein the gate driver is configured to receive the delayed digital switching control signal from the acceleration control signal generator circuitry and provide the gate drive signal to the gate drive node based on the delayed digital switching control signal.

13. The RF switching circuitry of claim 1 wherein the multi-level driver circuitry further comprises a plurality of overvoltage diodes coupled between the multi-level drive signal output node and the gate drive node.

14. The RF switching circuitry of claim 1 wherein the acceleration control signal generator circuitry comprises:
   a switching control signal input node configured to receive the switching control signal;
   an exclusive-NOR gate comprising a first input coupled to the switching control signal input node and a second input;
   a plurality of inverters coupled between the switching control signal input node and the second input of the exclusive-NOR gate;
   an acceleration control signal output node coupled to an output of the exclusive-NOR gate; and
   a delayed switching control signal output node coupled to an output of one of the plurality of inverters not coupled directly to the second input of the exclusive-NOR gate.

15. The RF switching circuitry of claim 14 wherein the multi-level driver circuitry further comprises a plurality of overvoltage diodes coupled between the multi-level drive signal output node and the gate drive node.

* * * * *

UNITED STATES PATENT AND TRADEMARK OFFICE
CERTIFICATE OF CORRECTION

PATENT NO. : 10,897,246 B2
APPLICATION NO. : 15/809198
DATED : January 19, 2021
INVENTOR(S) : Baker Scott et al.

It is certified that error appears in the above-identified patent and that said Letters Patent is hereby corrected as shown below:

In the Specification

Column 2, Lines 25 and 33, replace "the time constant r" with --the time constant $\tau$--.
Column 5, Line 62, replace "the time constant r" with --the time constant $\tau$--.
Column 8, Line 64, replace "resistor $R_D$" with --resistor $R_C$--.
Column 10, Line 8, replace "-2.5V" with --~2.5V--.
Column 10, Line 27, replace "the common resistor $R_D$" with --the common resistor $R_C$--.
Column 10, Line 32, replace "$CNT_{ADD}$" with --$CNT_{ACC}$--.

Signed and Sealed this
Twenty-third Day of March, 2021

Drew Hirshfeld
*Performing the Functions and Duties of the*
*Under Secretary of Commerce for Intellectual Property and*
*Director of the United States Patent and Trademark Office*